United States Patent
Conway et al.

(10) Patent No.: US 7,960,753 B2
(45) Date of Patent: Jun. 14, 2011

(54) SURFACE PLASMON POLARITON ACTUATED TRANSISTORS

(75) Inventors: Joshua A. Conway, Redondo Beach, CA (US); Ryan A. Stevenson, Maple Valley, WA (US); Jon V. Osborn, Thousand Oaks, CA (US)

(73) Assignee: The Aerospace Corporation, El Segundo, CA (US)

( * ) Notice: Subject to any disclaimer, the term of this patent is extended or adjusted under 35 U.S.C. 154(b) by 341 days.

(21) Appl. No.: 11/900,346

(22) Filed: Sep. 11, 2007

(65) Prior Publication Data

US 2009/0065801 A1 Mar. 12, 2009

(51) Int. Cl.
*H01L 29/24* (2006.01)
*H01L 29/10* (2006.01)
(52) U.S. Cl. .......................................... 257/104; 257/47
(58) Field of Classification Search .................... 257/47, 257/E31.65, 104, 449, E31.065
See application file for complete search history.

(56) References Cited

U.S. PATENT DOCUMENTS

| | | | | |
|---|---|---|---|---|
| 4,394,749 A | * | 7/1983 | Tsukada et al. | 365/106 |
| 5,414,282 A | * | 5/1995 | Ogura | 257/187 |
| 6,229,189 B1 | * | 5/2001 | Yap et al. | 257/414 |
| 6,713,832 B2 | * | 3/2004 | Pardo et al. | 257/459 |
| 7,026,701 B2 | * | 4/2006 | Scales et al. | 257/449 |

* cited by examiner

*Primary Examiner* — Hung Vu
(74) *Attorney, Agent, or Firm* — Paul D. Chancellor, Ocean Law

(57) ABSTRACT

A surface plasmon polaritron activated semiconductor device uses a surface plasmon wire that functions as an optical waveguide for fast communication of a signal and functions as a energy translator using a wire tip for translating the optical signal passing through the waveguide into plasmon-polaritron energy at a connection of the semiconductor device, such as a transistor, to activate the transistor for improved speed of communications and switching for preferred use in digital systems.

15 Claims, 3 Drawing Sheets

SURFACE PLASMOM POLARITON ACTUATED
BIPOLAR JUNCTION TRANSISTOR

SURFACE PLASMOM POLARITON ACTUATED
BIPOLAR JUNCTION TRANSISTOR

SURFACE PLASMOM POLARITON ACTUATED
FIELD EFFECT TRANSISTOR

SURFACE PLASMOM POLARITON ACTUATED
HETEROJUNCTION BIPOLAR TRANSISTOR

SURFACE PLASMON POLARITON ACTUATED TRANSISTORS

FIELD OF THE INVENTION

The invention relates to the field of semiconductors. More particularly the present invention relates to transistors having plasmon activation.

BACKGROUND OF THE INVENTION

U.S. Pat. No. 7,026,701 teaches rectangular type surface plasmon waveguides and buried rectangular surface plasmon waveguides for use in Schottky barrier detectors. These surface plasmon waveguides suffer from polarization dependence and fringe fields at the corners of the waveguides. To achieve amplification of the detected signal, such detectors require external amplifiers, which increase noise, reduce bandwidth, and increase system complexity The phototransistor, which is a photon-actuated transistor, is also well known in the art. Recent work has been done on phototransistors that are compatible with commercial silicon BiCMOS processes. These devices, however, are generally slow in frequency response due to the large area and thick base region. This is a fundamental limitation of these devices due to a mismatch in dimension between optical waveguides and semiconductor transistors within an integrated circuit. Diffraction will not allow micron-scale optical signals to be routed directly to nano-scale transistors.

Digital systems using conventional semiconductor technology are inherently low-bandwidth as compared to optical communications and processing of information in the optical regime. A fundamental problem currently facing microelectronic circuits is that intrachip and interchip metal interconnects cannot keep pace with the transistors in terms of bandwidth and latency. While the transistor is improving with each successive generation of lithography, the performance of the metallic interconnects degrades significantly when scaled down in size. Optical interconnects can resolve most of the physical issues, but optical interconnects are limited in size to dimensions on the order of the wavelength. Unfortunately, these sizes are orders of magnitude larger than those on the active region of modern semiconductor chips.

Conventional interconnects suffer from relatively low bandwidths as compared to the optical regime. The size of conventional phototransistors limits their frequency response and dark current. Plasmon waveguides suffer from polarization dependence and fringe fields limiting use in semiconductor devices. These and other disadvantages are solved or mitigated using the invention.

SUMMARY OF THE INVENTION

An object of the invention is to provide surface plasmon polariton actuated devices.

A further object of the invention is to provide surface plasmon polariton actuated semiconductor devices.

Yet a further object of the invention is to provide surface plasmon polariton actuated semiconductor transistors.

Another object of the invention is to provide surface plasmon polariton actuated bipolar junction transistors.

Yet another object of the invention is to provide surface plasmon polariton actuated field effect transistors.

Still another object of the invention is to provide surface plasmon polariton actuated heterojunction bipolar transistors.

Yet another object of the present invention is to route an optical signal to an individual transistor that is part of an integrated circuit.

The present invention is directed to a new class of semiconductors, namely, plasmon polariton semiconductors which receive and react to an input excitation. In the preferred forms, three terminal electronic switching transistors are controlled by a forth surface plasmon waveguide. These transistors receive optical communication signals that are coupled into semiconductor integrated circuit transistors through a surface plasmon waveguiding wire interconnect. The surface plasmon wire consists of a material of negative permittivity, which tapers at the end. With a cylindrical geometry or an aspect ratio that is nearly one, these surface plasmon wires can approach polarization insensitivity while concentrating the surface plasmon electromagnetic field to nanometer dimensions at the tip. The surface plasmon wire is brought into proximity with a controlling portion or connection of a transistor. In a first preferred form, the surface plasmon wire is applied to a base-collector junction of a bipolar junction transistor. In a third preferred form, the surface plasmon wire is connected to an emitter-base region of a heterojunction bipolar transistor. In a second preferred form, the surface plasmon wire is connected to the gate region of a field effect transistor.

The surface plasmons are produced by coupling an optical field to a surface plasmon mode in a suitable metal and can be efficiently coupled to conventional optical waveguides on a top interconnect layer. The surface plasmon wire merely consists of a tapered cylindrical geometry or rectangular prism with an aspect ratio near one, which mitigates polarization dependencies. The preferred form uses these surface plasmon wire tip geometries to achieve optical efficient coupling to sizes on the order of that of the transistor. It may then be absorbed with high efficiency. The surface plasmon wire is effectively an optical waveguide to channel photonic energy to the transistors. The high frequency electromagnetic fields, which comprise the surface plasmon are absorbed in semiconductor regions and generate electron-hole pairs, changing the conductivity and minority carrier concentrations in these areas of the device. The plasmon polaritron transistor can enable an optical interconnect scheme in which transistor switching is controlled by an optical signal through the surface plasmon wire interface. The tight optical confinement afforded by the surface plasmon waveguide allows for a smaller device with greatly reduced capacitance and much higher frequency operation. These and other advantages will become more apparent from the following detailed description of the preferred embodiment.

DETAILED DESCRIPTION OF THE PREFERRED EMBODIMENT

Figure 1:
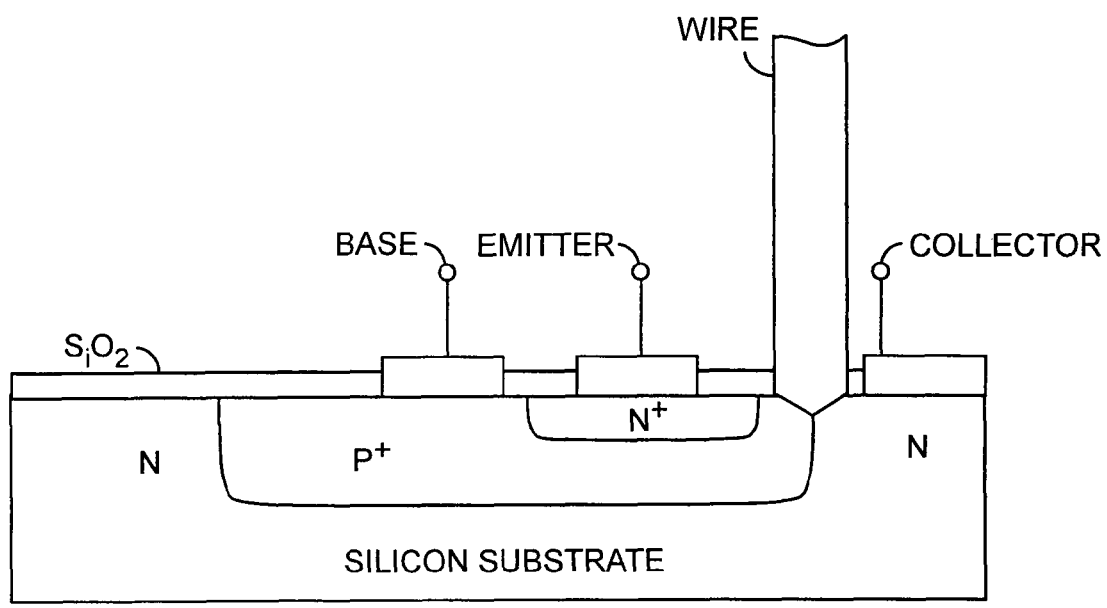
FIG. 1 is a drawing of a surface plasmon polariton actuated bipolar junction transistor.

An embodiment of the invention is described with reference to the figures using reference designations as shown in the figures. Referring to FIG. 1, a surface plasmon wire is shown with a top waveguide portion and a bottom tip portion. The tip is brought into proximity with the base-collector PN junction of a NPN bipolar junction transistor biased in the active mode. The surface plasmon wire is chosen to be optimally silver, or sub-optimally copper, gold, tungsten, or other suitable metal for surface plasmon waveguiding that is also compatible with current IC foundry processes. Conducting structures, such as carbon nanotubes, could also be used. One implementation of the wire is the use of a tapered copper via beginning at the integrated circuit top surface at 1 um and narrowing down to a nano-scale tip of 10 nm at the active device. A thin layer of dielectric can be used to isolate the surface plasmon wire from the semiconductor surface. An alternative embodiment could be the use of a PNP bipolar transistor instead of a NPN configuration. Also, annular contacting could be used.

The absorption of electromagnetic energy from the evanescent surface plasmon field in the base region and base-collector junction results in electron-hole pairs being generated within the semiconductor and a commensurate collector current. The resultant current developed in forward-biased emitter and base junction results in a current at the collector offering transistor gain. Essentially, the base current from a traditional bipolar junction transistor has been supplanted by a photonic generated current produced by the absorption of the surface plasmon. Additionally, electron-hole pairs created in the collector-base region generate collector current directly with unity gain. In analogy to a traditional bipolar junction transistor, the transistor on and off switching and channel resistance can be controlled by the surface plasmon signal. The base of the transistor can be biased in a switching mode and a linear mode. In the switching mode, the device is nearly conducting in the off state. With the addition of absorbed electromagnetic energy in the base and the base-collector regions, from the evanescent surface plasmon field, the transistor can be switched on. Removing the surface plasmon field will switch the transistor off again. In the linear mode, the transistor is biased in the linearly conducting active region with a fixed quiescent device collector current, such that, with the addition of absorbed electromagnetic energy from the evanescent surface plasmon field, the transistor can be switched further on, increasing the collector current proportionately. Removing the surface plasmon field will return the transistor back to the original quiescent bias condition.

The surface plasmon wire transports optical energy, in the form of surface plasmons, axially toward the transistor. The pointed tip of the wire serves to not only focus the plasmons spatially, but also slows the plasmons temporally. This slowing allows for the plasmonic energy to be absorbed in the sub-diffraction limited depletion region between the base and emitter. Absorption of the plasmonic energy creates electron-hole pairs by exactly the same physical mechanism as when a slab of semiconductor absorbs free-space photons. The electron-hole pairs are then swept across the depletion region, creating a flow of current between the base and emitter. This current is then amplified by standard transistor action across the base-emitter junction. Fabrication of the device can be achieved through standard silicon processing techniques, which are well known in the art. The addition of the plasmonic wire can be fabricated in the manner of conventional copper vias. The tapered shape can then be approximated with a wedding-cake structure common in standard metallic vias.

Figure 2:
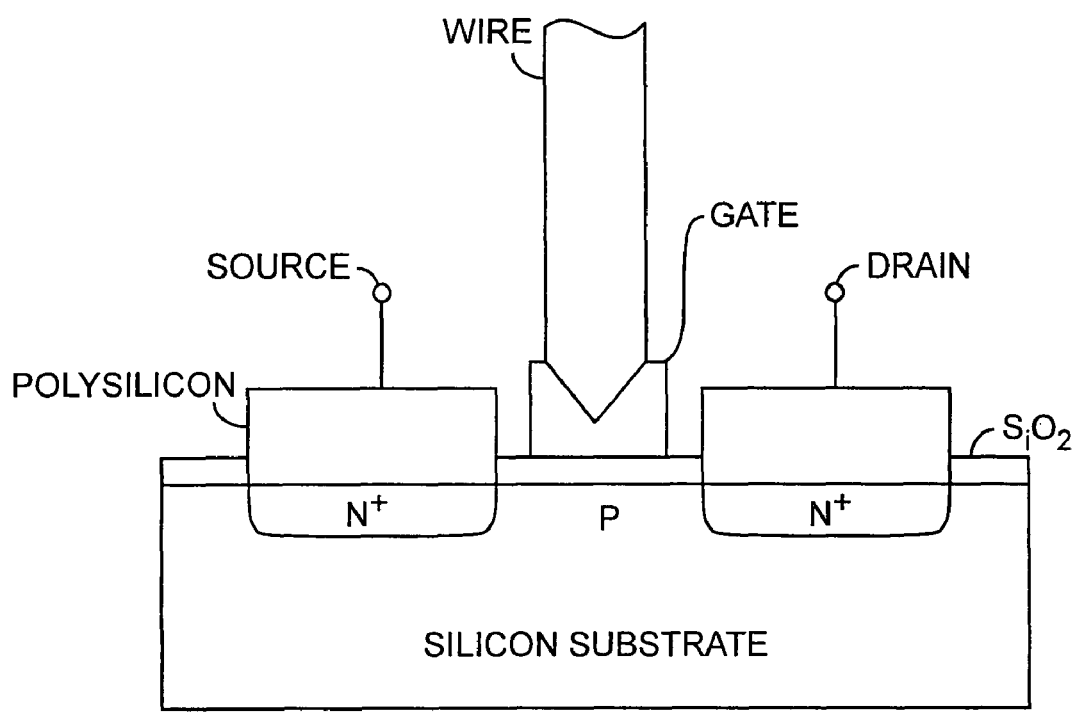
FIG. 2 is a drawing of a surface plasmon polariton actuated field effect transistor.

Referring to FIG. 2, the surface plasmon wires can also be used to couple an optical signal to the transistor plane of a field effect transistor as well. In a silicon embodiment, the surface plasmon wire is brought into contact with the poly-silicon gate contact of a metal oxide field effect transistor (MOSFET). The gate of the transistor can be advantageously biased while the surface plasmon is coupled to the channel. The gate of the transistor can be biased in the switching mode or the linear mode. In the switching mode, the channel of length L is nearly conducting in the off state. With the addition of absorbed electromagnetic energy in the channel region, from the evanescent surface plasmon field, the transistor can be switched on. Removing the surface plasmon field will switch the transistor off again. In the linear mode, such that the transistor is biased in the linearly conducting active region with a fixed quiescent device drain current, such that, with the addition of absorbed electromagnetic energy from the evanescent surface plasmon field, the transistor can be switched further on, increasing the drain current proportionately. Removing the surface plasmon field will return the transistor back to the original quiescent bias condition. These basic modes of operation may also be envisioned to be further refined into two distinct means of operation for each bias condition including channel deposition and gate deposition. In channel deposition, electromagnetic energy from the plasmonic wire is deposited in the channel region. In the gate deposition, the electromagnetic energy primarily creates electron-hole pairs in the polysilicon gate region and develops a small gate voltage across the gate capacitance, with the subsequent image charges formed at the channel-gate interface, causing enhanced drain current to flow.

The MOSFET device shown is preferably fabricated using conventional semiconductor processes. The surface plasmon wire replaces a conventional interconnects in the process. The surface plasmon wire diameter is formed using conventional lithographic techniques and the height is defined by using conventional dielectric isolation deposition means. The unique aspects of a surface plasmon wire are defined by the metallic material used and by the taper angle leading into the gate material of the device. The metal used for surface plasmon wire could be a conventional via metal such as tungsten, copper, titanium or platinum, however losses will be greater. When the length of the surface plasmon wire is short, less than 1 um, then the input optical intensity should be increased. However, when losses are to be a minimum, for a particular application, then the surface plasmon wire material may be optimally replaced with either silver or gold. Thin metallic adhesion layers and metal migration barriers such as titanium, nickel, and chrome, typically used in semiconductor processes, will add loss along the surface plasmon wire length. But, as long as those barrier metal layers are kept below approximately $\lambda/10$, the barrier metal layers will not appreciably affect the surface plasmon wire loss. The loss in the taper region is acceptable because the taper region is where energy deposition occurs.

The taper angle is optimized to minimize loss and maximize the effective rate of convergence of the surface plasmon electromagnetic field. The taper angle is typically 30 degrees, but depends on materials and optical frequency. The shape of the taper ideally would be a cone with a base diameter equal to the surface plasmon wire diameter with the cone tip terminating in a point. However, non-ideal tip shapes such as truncated cone, pyramid, truncated pyramid, hemispheres, and truncated hemispheres are also acceptable with varying degrees of loss rate along the taper. The exact shape of the tip determines the loss per unit length. As an example, when the surface plasmon wire tamper were completely located within the material where an energy deposit is desired, loss along the taper is acceptable, and a non-ideal tip shape could be used. Tip shape in this case could be defined using a simple isotropic etch process resulting in a dimple approximating a hemisphere. More complex isotropic etch processes such as KOH etching of crystalline silicon, reactive ion etching with sidewall passivation, or ion milling could alternatively be used to create tapers that would more closely approximate an ideal tip. The tip serves to initiate surface propagation of the surface plasmon electromagnetic energy with minimum loss, while focusing the energy to a minimal deposition volume at the apex of the tip.

Figure 3:
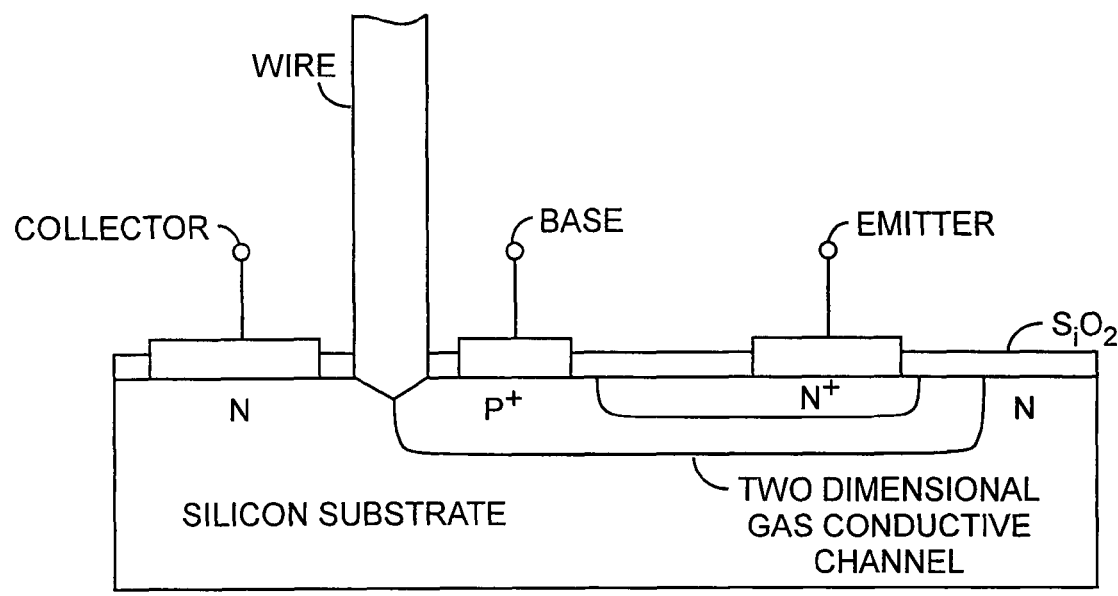
FIG. 3 is a drawing of a surface plasmon polariton actuated bipolar heterojunction transistor.

Referring to FIG. 3, a heterojunction bipolar transistor can also be equipped with a surface plasmon wire. The improvements of the heterojunction bipolar transistor over the bipolar junction transistor are achieved through the utilization of a heterojunction structure, which is well known in the art. The base is heavily doped, thereby eliminating a number of deleterious phenomena such as base-width modulation and extrinsic base resistance. Unfortunately, a heavily doped base leads to poor emitter injection efficiency. The inclusion of a higher band gap material for the emitter provides a built-in energy barrier that impedes forward-bias injection from the base to the emitter, thus giving rise to high emitter injection efficiency. Because the emitter material is different than the base material, a heterojunction exists between these two regions.

The heterojunction bipolar NPN transistor includes an N-doped emitter layer of a higher band gap to the underlying P-doped base. The interface between these two base and emitter layers forms a heterojunction. The surface plasmon wire can then be used by bringing the tip into proximity with the base-collector junction. The fundamental operation of the heterojunction bipolar transistor is the same as the simpler bipolar transistor, although the heterojunction bipolar transistor emitter is of a higher band gap material means that no photons from the surface plasmon mode will be absorbed in that material. This lack of absorption will contribute to higher efficiency in absorption of the surface plasmon photons in the base and collector-base regions. This configuration is also preferable because the charge carrier transport is in the vertical direction, which generally results in a faster transistor. The base of the transistor can be biased in the switching mode and in the linear mode. In the switching mode, when the device is nearly conducting, the device is in the off state. With the addition of absorbed electromagnetic energy in the base and collector-base regions, from the evanescent surface plasmon field, the transistor can be switched on. Removing the surface plasmon field will switch the transistor off again. In the linear mode, the transistor is biased in the linearly conducting active region with a fixed quiescent device collector current, such that, with the addition of absorbed electromagnetic energy from the evanescent surface plasmon field, the transistor can be switched further on, increasing the collector current proportionately. Removing the surface plasmon field will return the transistor back to the original quiescent bias condition. The surface plasmon fields are coupled and absorbed within the base and base-collector junction. When the emitter material is of the same band gap as the base and collector, some of the surface plasmon field will be absorbed in the emitter, thereby decreasing the coupling efficiency of the surface plasmon field. If, however, the emitter band gap is larger than the energy of the surface plasmon, then the emitter will be transparent to the surface plasmon field. Thus, the heterojunction bipolar transistor will yield the dual benefit of improved surface plasmon coupling efficiency and improved electrical characteristics. Finally, the heterojunction bipolar transistor structure allows for the surface plasmon wire to pass through the emitter without optical absorption in this undesirable region due to the larger bandgap. This is amenable to epitaxial fabrication of the heterojunction layer.

A surface plasmon-polariton waveguide is modified with a tip for creating an interconnect that can translate energy and couple an optical signal into electrical energy at a connection terminal of a semiconductor device. The waveguide portion of the surface plasmon wire provides for fast optical communication, whereas, the tip portion of the surface plasmon wire provides for the energy translation and coupling of the electron plasma into a conductor terminal of the device. The resultant plasmon-polariton oscillates at optical frequencies at very small wavelengths. The plasmon energy can be tightly confined to the surface of the waveguide portion. Due to the high wavelength compression, these surface plasmons can be guided with a metallic waveguide and tip structures in scale to very small interconnect sizes of integrated circuits.

These metallic surface plasmon wires can be used to bring surface plasmons into the transistor plane of an integrated circuit. When positioned, the evanescent portion of the field extending from the tip of the surface plasmon wire can be absorbed in the underlying semiconductor, effectively coupling the transistor to the optical signal. The evanescent surface plasmon field extends away from the tip of the surface plasmon wire for various geometries, optical wavelengths, and surrounding dielectric materials. The surface plasmon fields can be calculated analytically for the case of the cylindrically symmetric wire. An axial electric field for a 25 nm diameter copper wire can be stimulated with a free space optical wavelength of 1310 nm. The fields outside the wire are described by a Bessel function that falls off radially with a characteristic length of 72 nm. The characteristic decay length changes for various copper wire diameters and optical wavelengths. For copper wires of dimensions compatible with current integrated circuit foundry processes, and for optical wavelengths compatible with current optical communications standards, significant penetration depth of the evanescent surface plasmon field is possible.

The invention utilizes a surface plasmon interconnect to actuate a transistor. The devices can blend advantages of optical signaling bandwidth and latency with the processing requirements of an active layer. As a further advantage, the devices can be implemented with standard material processes, such as CMOS processing. Device dimensions can be drastically scaled to achieve much higher frequency bandwidths as another advantage over BiCMOS phototransistors. Specifically, this surface plasmon wire enables the coupling of photonic integrated circuit technology with more conventional nano-scale electronic integrated circuits and devices. As such, the applications could include wide-bandwidth optical receivers and transmitters, electrooptical analog to digital converters, electrooptical digital to analog converters, electrooptical inertial measurement devices, and electrooptical chip scale atomic clocks. Other applications include integrated circuit solutions handling the relevant signal processing in both the optical and electronic domains.

The invention is directed to semiconductor devices having a terminal that is electronically controlled by a surface plasmon waveguide with a tip referred to as a surface plasmon wire. In the case of transistors, a surface plasmon polariton actuated transistor is also referred to as a plasmistor. These surface plasmon devices solve the problem of slow interconnection by utilizing surface plasmon polariton wire structures as interconnects to the transistors comprising an integrated circuit. The surface plasmon devices can be applied to systems generally for large-scale chip interconnects. The very small photo-absorption volume of these surface plasmon devices reduces the dark current. As such, the devices can be used to make high sensitivity infrared detectors. Those skilled in the art can make enhancements, improvements, and modifications to the invention, and these enhancements, improvements, and modifications may nonetheless fall within the spirit and scope of the following claims.

What is claimed is:

1. A device activated by an optical signal, the device comprising,
a wire for conducting an optical signal and for creating surface plasmons, the wire comprising a waveguide portion for communicating the optical signal, the wire comprising a deposition portion, the deposition portion for translating photonic energy of the optical signal into plasmonic energy, and
a region for receiving the plasmonic energy and generating electrical energy, the electrical energy activating the device.

2. The device of claim 1 wherein, the device is a transistor.

3. The device of claim 1 wherein,
the device is a transistor, and
the surface plasmons create electron-hole pairs in the device for activating the device.

4. The device of claim 1 wherein,
the deposition portion is a tip.

5. The device of claim 1 wherein,
the device is a NPN bipolar transistor,
the deposition portion is a tip, and
the tip is disposed in an emitter-base region of the device.

6. The device of claim 1 wherein,
the device is a field effect transistor,
the deposition portion is a tip, and
the tip is disposed on a gate terminal of the device.

7. The device of claim 1 wherein,
the device heterojunction bipolar transistor,
the deposition portion is a tip, and
the tip is disposed in the base region of the device.

8. The device of claim 1 wherein,
the deposition portion is a tip, and
the tip is selected from the group consisting of cones, pyramids, and hemispheres.

9. The device of claim 1 wherein,
the wire is made of a metal.

10. The device of claim 1 wherein,
the wire is made of a metal, and
the metal is selected from the group consisting of silver, copper, gold, and tungsten.

11. The device of claim 1 wherein,
the device is a transistor deposed in an integrated circuit having a planar substrate of silicon.

12. The device of claim 1 wherein,
the device is a transistor turned on upon reception of the plasmonic energy from the surface plasmons and turned off upon the absence of the plasmonic energy.

13. The device of claim 1 wherein,
the device is a transistor linearly operating and controlled in conduction upon increase and decrease of plasmonic energy from the surface plasmons.

14. A device activated by an optical signal, the device comprising,
a wire for conducting an optical signal and for creating surface plasmons, the wire comprising a micron scale waveguide portion for communicating the optical signal, the wire comprising a nanometer scale deposition portion, the deposition portion for translating photonic energy of the optical signal into plasmonic energy, and
a region for receiving the plasmonic energy and generating electrical energy in response to the received plasmonic energy, the electrical energy activating the device.

15. A device activated by an optical signal, the device comprising,
a controlling terminal and two controlled terminals;
a wire for conducting an optical signal and for creating surface plasmons,
the wire comprising a micron scale waveguide portion for communicating the optical signal,
the wire comprising a nanometer scale tip portion for translating the optical signal into plasmonic energy,
the tip operable to couple the plasmonic energy into a controlling terminal of the device, and
the flow of plasmonic energy to the device operable to regulate device gain.

* * * * *